United States Patent
Teraguchi

(10) Patent No.: US 7,425,721 B2
(45) Date of Patent: Sep. 16, 2008

(54) FIELD-EFFECT TRANSISTOR

(75) Inventor: Nobuaki Teraguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/802,373

(22) Filed: May 22, 2007

(65) Prior Publication Data

US 2007/0272969 A1   Nov. 29, 2007

(30) Foreign Application Priority Data

May 23, 2006   (JP) .............................. 2006-143069

(51) Int. Cl.
   *H01L 29/778*   (2006.01)
   *H01L 29/06*    (2006.01)
   *H01L 29/78*    (2006.01)

(52) U.S. Cl. .................. 257/27; 257/192; 257/194; 257/E29.188; 257/E29.246

(58) Field of Classification Search .................. 257/27, 257/192, 194, E29.188, E29.246
   See application file for complete search history.

(56) References Cited

U.S. PATENT DOCUMENTS

| 5,192,987 A | 3/1993 | Khan et al. |
| 2005/0189559 A1 | 9/2005 | Saito et al. |
| 2006/0214188 A1 | 9/2006 | Kawasaki et al. |
| 2006/0237711 A1 | 10/2006 | Teraguchi |

FOREIGN PATENT DOCUMENTS

| JP | 2004-273486 A | 9/2004 |
| JP | 2004-335960 A | 11/2004 |
| JP | 2005-79346 A | 3/2005 |
| JP | 2005-244072 A | 9/2005 |
| JP | 2006-32650 A | 2/2006 |
| JP | 2006-156816 A | 6/2006 |
| JP | 2006-269534 A | 10/2006 |
| JP | 2006-332593 A | 12/2006 |
| JP | 2007-109830 A | 4/2007 |
| JP | 2007-165719 A | 6/2007 |

OTHER PUBLICATIONS

Myers et al., "GaN and Related Alloys—1999" Materials Research Society Symposium Proceeding, vol. 595, 1999, W6.2.7.

*Primary Examiner*—Evan Pert
(74) *Attorney, Agent, or Firm*—Birch, Stewart, Kolasch & Birch, LLP

(57) ABSTRACT

A field-effect transistor is provided which includes: a first nitride semiconductor layer having a lattice constant $a_1$ and a bandgap $Eg_1$; a second nitride semiconductor layer stacked on the first nitride semiconductor layer and having a lattice constant $a_2$ and a bandgap $Eg_2$; a source electrode and a drain electrode formed on the second nitride semiconductor layer; a piezo-effect film formed on the second nitride semiconductor layer in a region between the source electrode and the drain electrode; and a gate electrode formed on a region of the piezo-effect film. The relation between the lattice constants $a_1$ and $a_2$ is $a_1 > a_2$. The relation between the bandgaps $Eg_1$ and $Eg_2$ is $Eg_1 < Eg_2$. The residual polarization density at that surface of the piezo-effect film which faces the second nitride semiconductor layer is equal to or higher than the density of electric charges of a two-dimensional electron gas layer at an interface between the first nitride semiconductor layer and the second nitride semiconductor layer, and negative charges are polarized at that surface of the piezo-effect film which faces the second nitride semiconductor layer.

16 Claims, 8 Drawing Sheets

FIELD-EFFECT TRANSISTOR

This nonprovisional application is based on Japanese Patent Application No. 2006-143069 filed with the Japan Patent Office on May 23, 2006, the entire contents of which are hereby incorporated by reference.

BACKGROUND OF THE INVENTION

1. Field of the Invention

The present invention relates to a field-effect transistor (FET) and more particularly a normally-off type FET including a heterostructure of nitride semiconductor layers.

2. Description of the Background Art

A conventional FET using a group III-V compound nitride semiconductor includes a heterostructure of a GaN layer and an AlGaN layer on a substrate (see Patent Document 1: U.S. Pat. No. 5,192,987). Here, the AlGaN layer has a smaller lattice constant than the GaN layer.

SUMMARY OF THE INVENTION

In formation of this heterostructure, a thin AlGaN layer having a thickness of, for example, 20 nm is epitaxially grown on a relatively thick GaN layer having a thickness of, for example, 1 µm. Here, the AlGaN layer has a small lattice constant $a_{AlGaN}$ as compared with a lattice constant $a_{GaN}$ of the GaN layer. In other words, $a_{GaN} > a_{AlGaN}$. Therefore, the AlGaN layer receives tensile stress from the GaN layer. Piezoelectric charges induced by this tensile stress and electric charges due to spontaneous polarization characteristic of a nitride semiconductor having a wurtzite structure are confined in an interface level formed on the GaN layer side having a relatively small bandgap at the interface between the AlGaN layer and the GaN layer, whereby a two-dimensional electron gas layer is automatically formed.

In other words, in the conventional FET having a heterostructure, even when a gate voltage is zero, a region (channel region) in which electrons are present is formed to cause electrons to flow. Thus, this FET is called a normally-on type.

The graph in FIG. 12 schematically illustrates an example of a $I_D$-$V_{DS}$ characteristic of such a normally-on type FET. In this graph, the axis of abscissas represents a source-drain voltage $V_{DS}$ and the axis of ordinates represents a drain current $I_D$. As can be seen from FIG. 12, even if gate voltage Vg is 0V, application of voltage $V_{DS}$ between source and drain causes drain current $I_D$ to flow.

In considering the application to a general circuit, a normally-off type FET is more desirably used, in which current $I_D$ does not flow when gate voltage Vg is 0V. This is because the normally-off type avoids the possibility that overcurrent flows between source and drain even in the event that a problem occurs in the circuit, as long as voltage Vg is not applied to the gate, thereby greatly reducing the possibility that the semiconductor device is broken. On the other hand, in the use of the normally-on type, when gate voltage Vg becomes zero for some reasons, overcurrent flows between source and drain, possibly destroying FET itself.

The normally-off type FET can be formed with MOS (metal-oxide-semiconductor) using Si. In MOSFET using Si, as shown in the graph in FIG. 13 similar to FIG. 12, when gate voltage Vg is 0V, drain current $I_D$ does not flow even with the application of voltage $V_{DS}$ between source and drain.

In an n-type MOSFET using Si, an n-type source region and an n-type drain region are formed slightly spaced from each other on a p-type Si substrate. A similar structure can theoretically be formed using a GaN substrate. However, in the use of a GaN substrate, it is not easy to form a high-quality p-type layer, and it is extremely difficult to form an n-type region in a p-type layer by ion implantation or diffusion as in the case of Si. Therefore, MOSFET not including a heterostructure (GaN-MOSFET) has not yet been realized. On the other hand, MOSFET including a heterostructure of AlGaN layer/GaN layer (MOS-HFET) exists, which is, however, the normally-on type.

As compared with the case using Si, the advantages of forming a normally-off type FET using GaN are that a short switching time can be expected because of high electron mobility in GaN as compared with in Si and that power loss of FET is greatly improved to 1/5-1/10 thereby allowing energy savings and size reduction of electronic devices.

However, when FET including a heterostructure of nitride semiconductor layers such as AlGaN layer/GaN layer is fabricated, as described above, it is difficult to fabricate a normally-off type FET.

An object of the present invention is therefore to provide a normally-off type FET including a heterostructure of nitride semiconductor layers.

As a result of elaborate study, the present inventor realized a normally-off type FET including a heterostructure of nitride semiconductor layers thereby to complete the present invention.

The present invention provides a field-effect transistor including: a first nitride semiconductor layer having a lattice constant $a_1$ and a bandgap $Eg_1$; a second nitride semiconductor layer stacked on the first nitride semiconductor layer and having a lattice constant $a_2$ and a bandgap $Eg_2$; a source electrode and a drain electrode formed on the second nitride semiconductor layer; a piezo-effect film formed on the second nitride semiconductor layer in at least a part of a region between the source electrode and the drain electrode; and a gate electrode formed on a region of at least a part of the piezo-effect film. The relation between the lattice constants $a_1$ and $a_2$ is $a_1 > a_2$. The relation between the bandgaps $Eg_1$ and $Eg_2$ is $Eg_1 < Eg_2$. A residual polarization density at that surface of the piezo-effect film which faces the second nitride semiconductor layer is equal to or higher than a density of electric charges of a two-dimensional electron gas layer at an interface between the first nitride semiconductor layer and the second nitride semiconductor layer, and negative charges are polarized at that surface of the piezo-effect film which faces the second nitride semiconductor layer.

The present invention also provides a field-effect transistor including: a first nitride semiconductor layer having a lattice constant $a_1$ and a bandgap $Eg_1$; a second nitride semiconductor layer stacked on the first nitride semiconductor layer and having a lattice constant $a_2$ and a bandgap $Eg_2$; a source electrode and a drain electrode formed on the second nitride semiconductor layer; a piezo-effect film formed on the second nitride semiconductor layer in at least a part of a region between the source electrode and the drain electrode; and a gate electrode formed on a region of at least a part of the piezo-effect film. The relation between the lattice constants $a_1$ and $a_2$ is $a_1 < a_2$. The relation between the bandgaps $Eg_1$ and $Eg_2$ is $Eg_1 > Eg_2$. A residual polarization density at that surface of the piezo-effect film which faces the second nitride semiconductor layer is equal to or higher than a density of electric charges of a two-dimensional electron gas layer at an interface between the first nitride semiconductor layer and the second nitride semiconductor layer, and positive charges are polarized at that surface of the piezo-effect film which faces the second nitride semiconductor layer.

In the field-effect transistor of the present invention, preferably, the piezo-effect film is formed of an oxide having a perovskite structure.

In the field-effect transistor of the present invention, as an oxide having a perovskite structure, an oxide including Ba and Ti, an oxide including Pb, La, Zr and Ti, an oxide including Sr, Bi and Ta, an oxide including Bi and Ti, an oxide including Li and Nb, or an oxide including Sr and Nb may be used.

In the field-effect transistor of the present invention, the piezo-effect film may be formed of a fluoride having a fluorite structure.

In the field-effect transistor of the present invention, as a fluoride having a fluorite structure, a fluoride including Ba and Mg or a fluoride including Ba and Mn may be used.

In the field-effect transistor of the present invention, the piezo-effect film may be formed by a sputtering method.

In the field-effect transistor of the present invention, the piezo-effect film may be formed under an atmospheric pressure of less than 1 Pa by a sputtering method.

In the field-effect transistor of the present invention, the piezo-effect film may be formed under an atmospheric pressure of larger than 1 Pa by a sputtering method.

The present invention also provides a field-effect transistor including: a first nitride semiconductor layer having a lattice constant $a_1$ and a bandgap $Eg_1$; a second nitride semiconductor layer stacked on the first nitride semiconductor layer and having a lattice constant $a_2$ and a bandgap $Eg_2$; a source electrode and a drain electrode formed on the second nitride semiconductor layer; a piezo-effect film formed on the second nitride semiconductor layer in at least a part of a region between the source electrode and the drain electrode; and a gate electrode formed on a region of at least a part of the piezo-effect film. The relation between the lattice constants $a_1$ and $a_2$ is $a_1 > a_2$. The relation between the bandgaps $Eg_1$ and $Eg_2$ is $Eg_1 < Eg_2$. A residual polarization density at that surface of the piezo-effect film which faces the second nitride semiconductor layer is equal to or higher than a density of electric charges of a two-dimensional electron gas layer at an interface between the first nitride semiconductor layer and the second nitride semiconductor layer, and negative charges are polarized at that surface of the piezo-effect film which faces the second nitride semiconductor layer. The piezo-effect film exerts compressive stress on the second nitride semiconductor layer.

The present invention also provides a field-effect transistor including: a first nitride semiconductor layer having a lattice constant $a_1$ and a bandgap $Eg_1$; a second nitride semiconductor layer stacked on the first nitride semiconductor layer and having a lattice constant $a_2$ and a bandgap $Eg_2$; a source electrode and a drain electrode formed on the second nitride semiconductor layer; a piezo-effect film formed on the second nitride semiconductor layer in at least a part of a region between the source electrode and the drain electrode; and a gate electrode formed on a region of at least a part of the piezo-effect film. The relation between the lattice constants $a_1$ and $a_2$ is $a_1 < a_2$. The relation between the bandgaps $Eg_1$ and $Eg_2$ is $Eg_1 > Eg_2$. A residual polarization density at that surface of the piezo-effect film which faces the second nitride semiconductor layer is equal to or higher than a density of electric charges of a two-dimensional electron gas layer at an interface between the first nitride semiconductor layer and the second nitride semiconductor layer, and positive charges are polarized at that surface of the piezo-effect film which faces the second nitride semiconductor layer. The piezo-effect film exerts tensile stress on the second nitride semiconductor layer.

According to the present invention, it is possible to provide a normally-off type FET including a heterostructure of nitride semiconductor layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
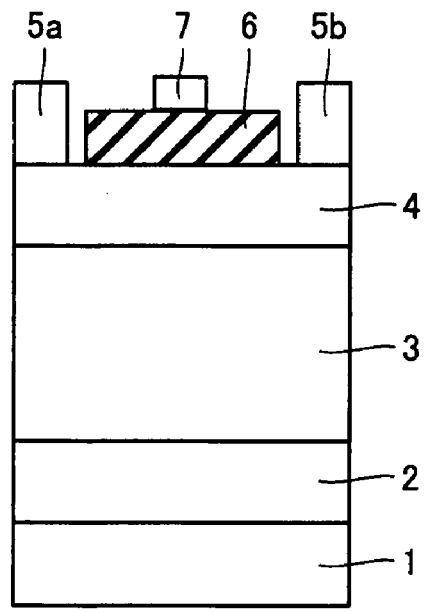
FIG. 1 is a schematic cross-sectional view of a preferable example of FET in accordance with the present invention.

In the following, embodiments of the present invention will be described. It is noted that in the drawings of the present invention the same reference characters represent the same parts or the corresponding parts.

First Embodiment

FIG. 1 is a schematic cross-sectional view of a preferable example of FET in accordance with the present invention. Here, FET of the present invention has a structure in which a buffer layer 2 formed of AlN, a first nitride semiconductor layer 3 formed of GaN, and a second nitride semiconductor layer 4 formed of $Al_{0.3}Ga_{0.7}N$ are stacked on a semiconductor substrate 1 formed of SiC in the c-axis direction in this order by hetero-epitaxial growth. A source electrode 5a is formed on one end of a surface of second nitride semiconductor layer 4 and a drain electrode 5b is formed on the other end thereof. Furthermore, a piezo-effect film 6 having a piezo effect is formed on a region of the surface of second nitride semiconductor layer 4 between source electrode 5a and drain electrode 5b, and a gate electrode 7 is formed on a region of a surface of piezo-effect film 6.

Here, first nitride semiconductor layer 3 formed of GaN has a lattice constant $a_1$ and a bandgap $Eg_1$ ($a_1$=3.189 Å, $Eg_1$=3.42 eV), and second nitride semiconductor layer 4 formed of $Al_{0.3}Ga_{0.7}N$ has a lattice constant $a_2$ and a bandgap $Eg_2$ ($a_2$=3.166 Å, $Eg_2$=4.02 eV). Therefore, the relation between lattice constant $a_1$ and lattice constant $a_2$ is $a_1 > a_2$, and the relation between bandgap $Eg_1$ and bandgap $Eg_2$ is $Eg_1 < Eg_2$.

Figure 2:
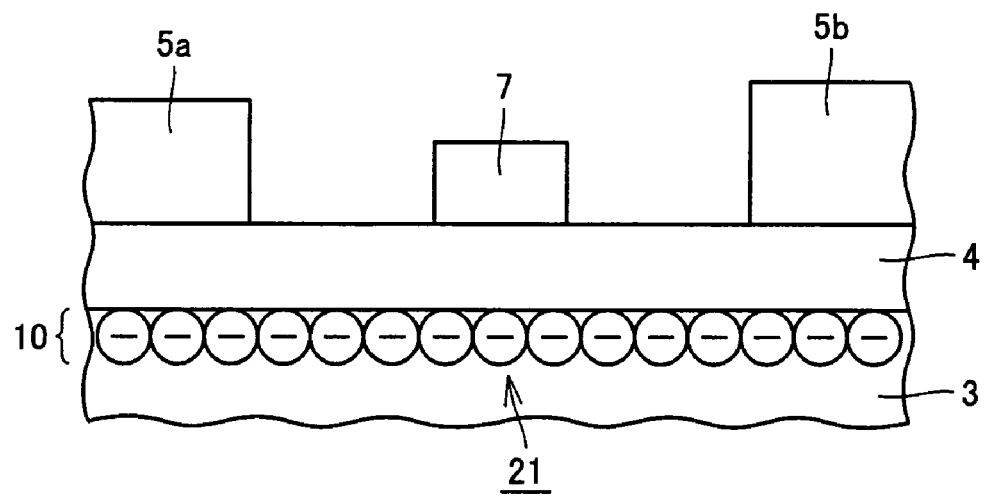
FIG. 2 is a schematic view of a part of a conventional FET.

For example, in the conventional FET disclosed in Patent Document 1 in which piezo-effect film 6 is not formed, as shown in the schematic view in FIG. 2, a two-dimensional electron gas layer 10 is formed on the first nitride semiconductor layer 3 side of the interface between first nitride semiconductor layer 3 formed of GaN and second nitride semiconductor layer 4 formed of $Al_{0.3}Ga_{0.7}N$.

Then, in FET of the present invention, piezo-effect film 6 is formed on a region of at least part of the surface of second nitride semiconductor layer 4 in order to produce an electric field (polarization) in the c-axis direction. Then, the residual polarization density at that surface of piezo-effect film 6 which faces second nitride semiconductor layer 4 is set equal to or higher than the density of electric charges of two-dimensional electron gas 21 of two-dimensional electron gas layer 10 formed on the first nitride semiconductor layer 3 side of the interface between first nitride semiconductor layer 3 and second nitride semiconductor layer 4.

Figure 3A:
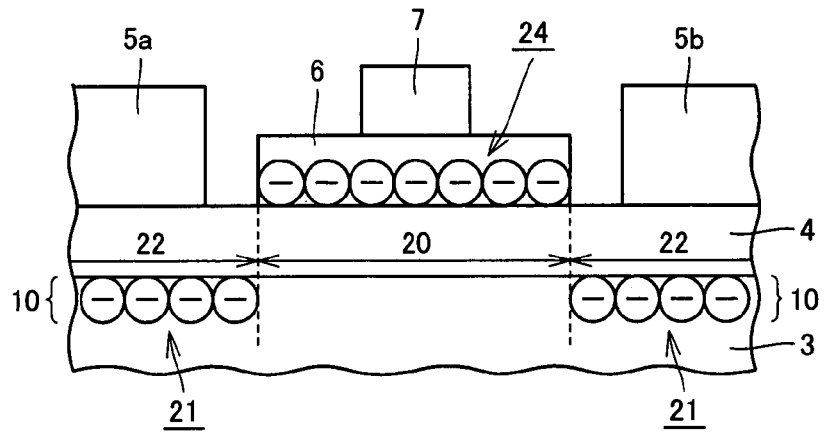
FIGS. 3A-3C are schematic views showing a part of a preferable example of FET in accordance with the present invention.

Accordingly, as shown in the schematic view in FIG. 3A, for example, the residual polarization of piezo-effect film 6 can cancel two-dimensional electron gas 21 (negative charge) forming two-dimensional electron gas layer 10 positioned in a region 20 corresponding to the region in which piezo-effect film 6 is formed, so that two-dimensional electron gas layer 10 only exists in a region 22 corresponding to the outside of the region in which piezo-effect film 6 is formed.

In other words, for example, assuming that the number density (the number of two-dimensional electron gas 21 present per $cm^2$) of two-dimensional electron gas 21 of the aforementioned two-dimensional electron gas layer 10 is $1 \times 10^{14}/cm^2$, the density of electric charges of two-dimensional electron gas 21 forming two-dimensional electron gas layer 10 can be calculated by multiplying the number density by an elementary electric charge $1.602 \times 10^{-19}$ C. Here, the density of electric charges of two-dimensional electron gas 21 forming two-dimensional electron gas layer 10 is $1 \times 10^{14}/cm^2 \times 1.602 \times 10^{-19}$ C=16.02 μC/$cm^2$.

Therefore, when such a film is formed as piezo-effect film 6 in that the residual polarization density (point A in FIG. 4) at that surface of piezo-effect film 6 which faces second nitride semiconductor layer 4 is equal to or higher than −16.02 μC/$cm^2$, negative charges 24 polarized at that surface of piezo-effect film 6 which faces second nitride semiconductor layer 4 induce positive charges at the same number density as the number density (the number of negative charges 24 present per $cm^2$) of negative charges 24 polarized at piezo-effect film 6 on the first nitride semiconductor layer 3 side of the interface between first nitride semiconductor layer 3 and second nitride semiconductor layer 4. As a result, for example, as shown in FIG. 3A, the two-dimensional electron gas forming two-dimensional electron gas layer 10 is cancelled.

Therefore, in FET of the present invention, when a gate voltage is not applied from gate electrode 7 to piezo-effect film 6, even if voltage is applied between source electrode 5a and drain electrode 5b, current does not flow between source electrode 5a and drain electrode 5b, since two-dimensional electron gas layer 10 is partitioned in region 20 corresponding to the region in which piezo-effect film 6 is formed.

Figure 3B:
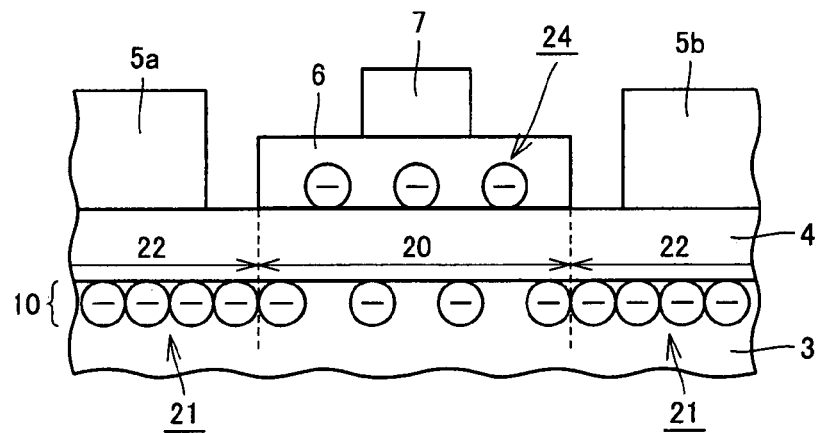

Next, as a gate voltage is applied to piezo-effect film 6, for example, as shown in FIG. 3B, the number of negative charges 24 decreases which are polarized at that surface of piezo-effect film 6 which faces second nitride semiconductor layer 4.

Figure 4:
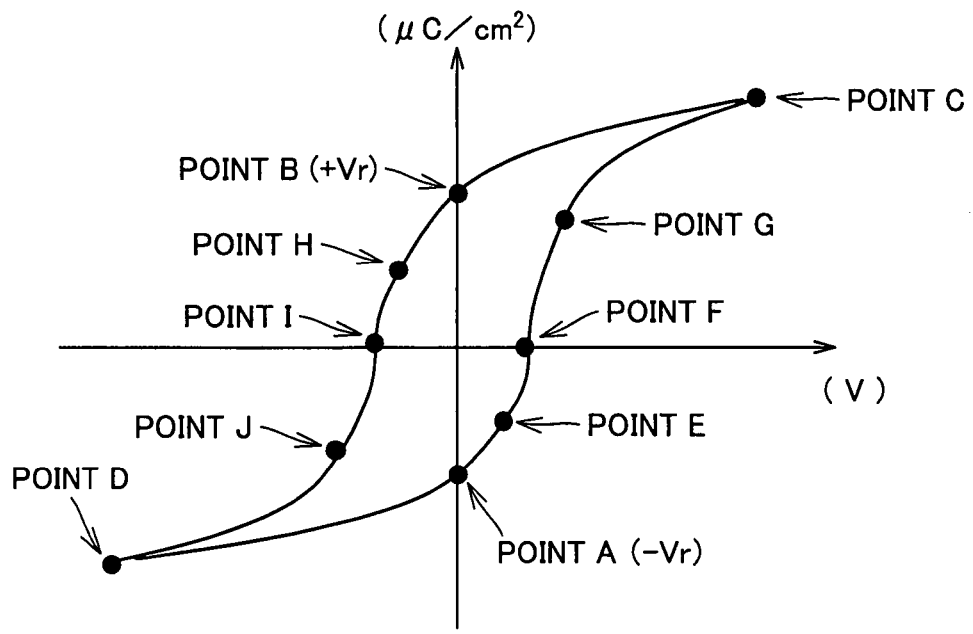
FIG. 4 is an illustration of an example of changed residual polarization density of a piezo-effect film used in the present invention.

For example, supposing the residual polarization density at that surface of piezo-effect film 6 which faces second nitride semiconductor layer 4 decreases to point E shown in FIG. 4 (the point at which the residual polarization density is half that of point A), the number density of negative charges 24 polarized at that surface of piezo-effect film 6 which faces second nitride semiconductor layer 4 becomes half that of point A.

In this case, with only induction of positive charges on the first nitride semiconductor layer 3 side of the interface between first nitride semiconductor layer 3 and second nitride semiconductor layer 4 by polarization of piezo-effect film 6, the two-dimensional electron gas of two-dimensional electron gas layer 10 in region 20 corresponding to the formation region of piezo-effect film 6 cannot completely be cancelled. Therefore, in this case, when voltage is applied between source electrode 5a and drain electrode 5b, current flows between source electrode 5a and drain electrode 5b.

Figure 3C:
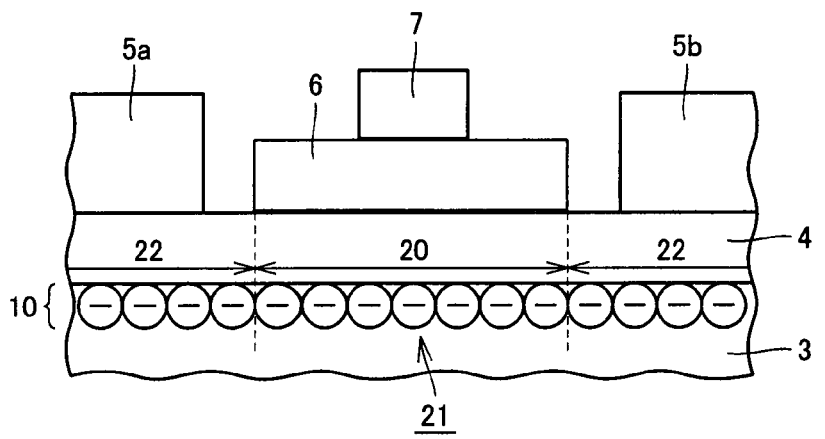

Furthermore, supposing the residual polarization density of piezo-effect film 6 is decreased to point F shown in FIG. 4 by the application of the gate voltage, for example, as shown in FIG. 3C, the number of negative charges polarized at that surface of piezo-effect film 6 facing second nitride semiconductor layer 4 becomes zero, so that positive charges are not induced on the first nitride semiconductor layer 3 side of the interface between first nitride semiconductor layer 3 and second nitride semiconductor layer 4. Therefore, when voltage is applied between source electrode 5a and drain electrode 5b, current flows between source electrode 5a and drain electrode 5b with a current density equivalent to that of the conventional FET disclosed in Patent Document 1.

Furthermore, in a case where the polarization of piezo-effect film 6 is reversed by applying the gate voltage until the residual polarization density of piezo-effect film 6 reaches point G shown in FIG. 4, negative charges are further induced on the first nitride semiconductor layer 3 side of the interface between first nitride semiconductor layer 3 and second nitride semiconductor layer 4, so that the number of two-dimensional electron gas forming the two-dimensional electron gas layer becomes larger than that in the conventional FET disclosed in Patent Document 1 in which piezo-effect film 6 is not formed. Therefore, when voltage is applied between source electrode 5a and drain electrode 5b, current flows between source electrode 5a and drain electrode 5b with a current density higher than that of the conventional FET disclosed in Patent Document 1.

In this manner, according to the present invention, it is possible to provide a normally-off type FET including a heterostructure of nitride semiconductor layers, in which when a gate voltage is not applied from gate electrode 7 to piezo-effect film 6, current does not flow between source electrode 5a and drain electrode 5b, and when a gate voltage is applied from gate electrode 7 to piezo-effect film 6, current flows between source electrode 5a and drain electrode 5b.

Second Embodiment

Figure 5:
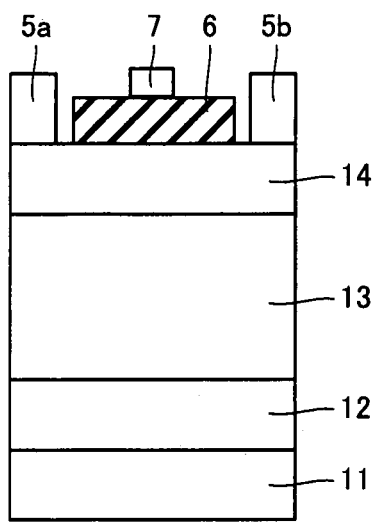
FIG. 5 is a schematic cross-sectional view of another preferable example of FET in accordance with the present invention.

FIG. 5 shows a schematic cross-sectional view of another preferable example of FET in accordance with the present invention. Here, FET of the present invention has a structure in which a buffer layer 12 formed of AlN, a first nitride semiconductor layer 13 formed of $Al_{0.3}Ga_{0.7}N$, and a second nitride semiconductor layer 14 formed of GaN are stacked on a semiconductor substrate 11 formed of SiC in the c-axis direction in this order by hetero-epitaxial growth. Source electrode 5a is formed on one end of a surface of second nitride semiconductor layer 14 and drain electrode 5b is formed on the other end thereof. Furthermore, piezo-effect film 6 having a piezo effect is formed on a region of the surface of second nitride semiconductor layer 14 between source electrode 5a and drain electrode 5b, and gate electrode 7 is formed on a region of a surface of piezo-effect film 6.

Here, first nitride semiconductor layer 13 formed of $Al_{0.3}Ga_{0.7}N$ has a lattice constant $a_1$ and a bandgap $Eg_1$ ($a_1$=3.166 Å, $Eg_1$=4.02 eV), and second nitride semiconductor layer 14 formed of GaN has a lattice constant $a_2$ and a bandgap $Eg_2$ ($a_2$=3.189 Å, $Eg_2$=3.42 eV). Therefore, the relation between lattice constant $a_1$ and lattice constant $a_2$ is $a_1<a_2$, and the relation between bandgap $Eg_1$ and bandgap $Eg_2$ is $Eg_1>Eg_2$.

Figure 6:
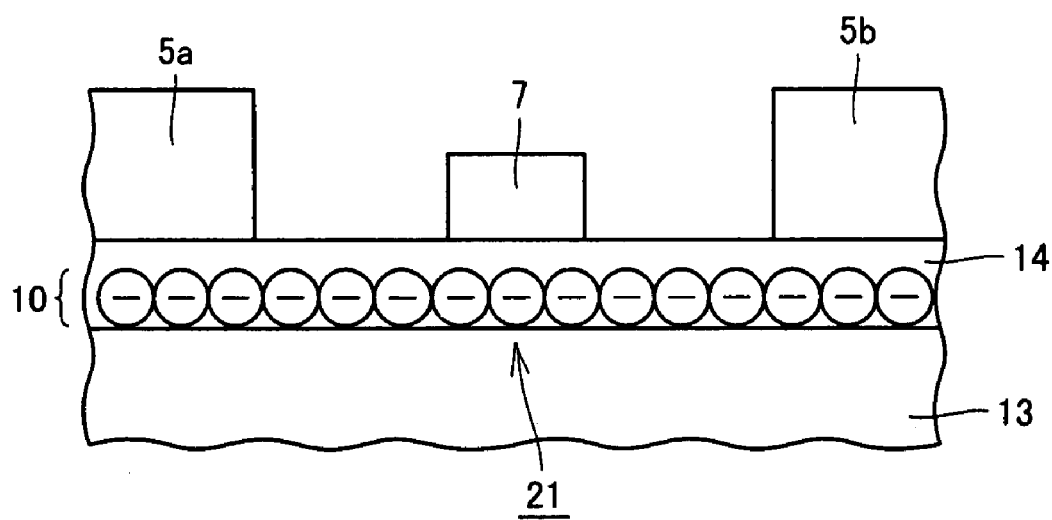
FIG. 6 is a schematic view of a part of a conventional FET.

For example, in the case where piezo-effect film 6 is not formed, as shown in the schematic view in FIG. 6, two-dimensional electron gas layer 10 is formed on the second nitride semiconductor layer 14 side of the interface between first nitride semiconductor layer 13 formed of $Al_{0.3}Ga_{0.7}N$ and second nitride semiconductor layer 14 formed of GaN.

Then, in FET of the present invention, piezo-effect film 6 is formed on a region of at least part of the surface of second nitride semiconductor layer 14 in order to produce an electric field (polarization) in the c-axis direction. Then, the residual polarization density at that surface of piezo-effect film 6 which faces second nitride semiconductor layer 14 is set equal to or higher than the density of electric charges of two-dimensional electron gas 21 of two-dimensional electron gas layer 10 formed on the second nitride semiconductor layer 14 side of the interface between first nitride semiconductor layer 13 and second nitride semiconductor layer 14.

Figure 7A:
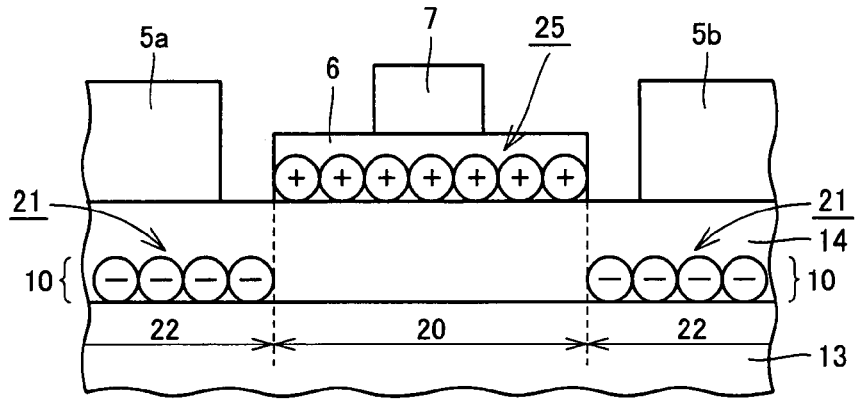
FIGS. 7A-7C are schematic views showing a part of another preferable example of FET in accordance with the present invention.

Accordingly, as shown in the schematic view in FIG. 7A, for example, the residual polarization (positive charge) at that surface of piezo-effect film 6 facing second nitride semiconductor layer 14 can cancel two-dimensional electron gas (negative charge) forming two-dimensional electron gas layer 10 positioned in region 20 corresponding to the region in which piezo-effect film 6 is formed, so that two-dimensional electron gas layer 10 only exists in region 22 corresponding to the outside of the region in which piezo-effect film 6 is formed.

In other words, for example, assuming that the number density of two-dimensional electron gas 21 of the aforementioned two-dimensional electron gas layer 10 is $1\times10^{14}/cm^2$, the density of electric charges of two-dimensional electron gas 21 forming two-dimensional electron gas layer 10 can be calculated by multiplying the number density by an elementary electric charge $1.602\times10^{-19}$ C. Here, the density of electric charges of two-dimensional electron gas 21 forming two-dimensional electron gas layer 10 is $1\times10^{14}/cm^2 \times 1.602\times10^{-19}$ C=16.02 μC/$cm^2$;

Therefore, when such a film is formed as piezo-effect film 6 in that the residual polarization density (point B in FIG. 4) is equal to or higher than +16.02 μC/$cm^2$, positive charges 25 polarized at that surface of piezo-effect film 6 which faces second nitride semiconductor layer 14 induce positive charges at the same number density as that of positive charges 25 on the second nitride semiconductor layer 14 side of the interface between first nitride semiconductor layer 13 and second nitride semiconductor layer 14. As a result, for example, as shown in FIG. 7A, the two-dimensional electron gas 21 (negative charge) forming two-dimensional electron gas layer 10 is cancelled.

Therefore, in FET of the present invention, when a gate voltage is not applied from gate electrode 7 to piezo-effect film 6, even if voltage is applied between source electrode 5a and drain electrode 5b, current does not flow between source electrode 5a and drain electrode 5b, since two-dimensional electron gas layer 10 is partitioned in region 20 corresponding to the region in which piezo-effect film 6 is formed.

Figure 7B:
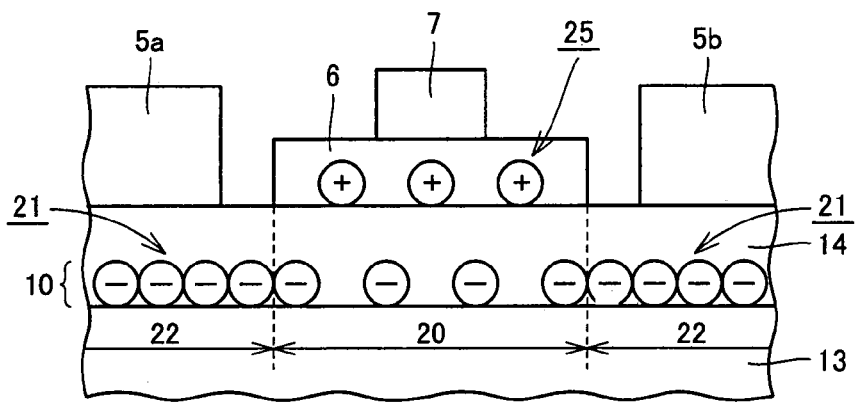

Next, as a gate voltage is applied to piezo-effect film 6, for example, as shown in FIG. 7B, the number of positive charges 25 decreases which are polarized at that surface of piezo-effect film 6 which faces second nitride semiconductor layer 14.

For example, supposing the residual polarization density at that surface of piezo-effect film 6 which faces second nitride semiconductor layer 14 decreases to point H shown in FIG. 4 (the point at which the residual polarization density is half that of point B), the number density (the number of positive charges 25 present per $cm^2$) of positive charges 25 polarized at that surface of piezo-effect film 6 which faces second nitride semiconductor layer 14 becomes half that of point B.

In this case, with only induction of positive charges on the second nitride semiconductor layer 14 side of the interface between first nitride semiconductor layer 13 and second nitride semiconductor layer 14 by polarization of piezo-effect film 6, two-dimensional electron gas 21 of two-dimensional electron gas layer 10 in region 20 corresponding to the formation region of piezo-effect film 6 cannot completely be cancelled. Therefore, when voltage is applied between source electrode 5a and drain electrode 5b, current flows between source electrode 5a and drain electrode 5b.

Figure 7C:
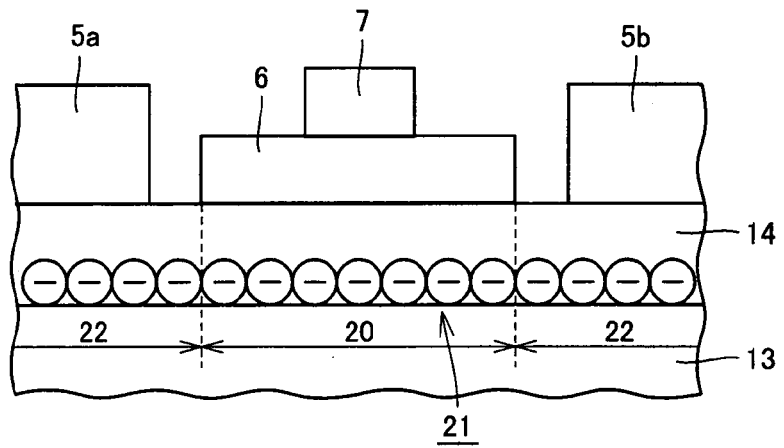

Furthermore, supposing the residual polarization density of piezo-effect film 6 is decreased to point I shown in FIG. 4 by application of the gate voltage, for example, as shown in FIG. 7C, the number of positive charges polarized at that surface of piezo-effect film 6 facing second nitride semiconductor layer 14 becomes zero, so that positive charges are not induced on the second nitride semiconductor layer 14 side of the interface between first nitride semiconductor layer 13 and second nitride semiconductor layer 14. Therefore, when voltage is applied between source electrode 5a and drain electrode 5b, current flows between source electrode 5a and drain electrode 5b with a current density equivalent to that of the conventional FET disclosed in Patent Document 1.

Furthermore, in a case where the polarization of piezo-effect film 6 is reversed by applying the gate voltage until the residual polarization density of piezo-effect film 6 reaches point J shown in FIG. 4, negative charges are further induced on the second nitride semiconductor layer 14 side of the interface between first nitride semiconductor layer 13 and second nitride semiconductor layer 14, so that the number of two-dimensional electron gas 21 forming two-dimensional electron gas layer 10 becomes larger than that of the case where piezo-effect film 6 is not formed. Therefore, when voltage is applied between source electrode 5a and drain electrode 5b, current flows between source electrode 5a and drain electrode 5b with a current density higher than that of the conventional FET disclosed in Patent Document 1.

In this manner, according to the present invention, it is possible to provide a normally-off type FET including a heterostructure of nitride semiconductor layers, in which when a gate voltage is not applied from gate electrode 7 to piezo-effect film 6, current does not flow between source electrode 5a and drain electrode 5b, and when a gate voltage is applied from gate electrode 7 to piezo-effect film 6, current flows between source electrode 5a and drain electrode 5b.

In the present invention, as piezo-effect film 6, oxides having a perovskite structure can preferably be used. There are some kinds of materials having the piezo effect. Among these, oxides having a perovskite structure have a great piezo effect thereby allowing efficient channel control. As an oxide having a perovskite structure, for example, an oxide including Ba and Ti, an oxide including Pb, La, Zr and Ti, an oxide including Sr, Bi and Ta, an oxide including Bi and Ti, an oxide including Li and Nb, or an oxide including Sr and Nb may be used. More specifically, $BaTiO_3$, (Pb, La) (Zr, Ti)$O_3$, $SrBi_2Ta_2O_9$, $Bi_4Ti_3O_9$, $LiNbO_3$, $Sr_2Nb_2O_7$, or the like may be used. These oxides have such a great piezo effect that it is applied to FeRAM (Ferroelectric Random Access Memory).

Alternatively, in the present invention, as piezo-effect film 6, fluorides having a fluorite structure may be used. Fluoride having a fluorite structure is also a material having the piezo-effect. More specifically, $BaMgF_4$, $BaMnF_4$ or the like having a fluorite structure may be used.

Figure 8:
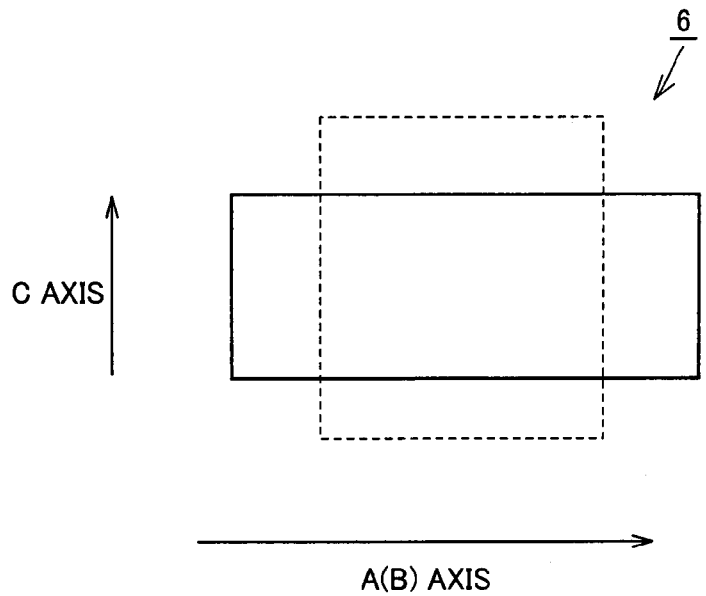
FIG. 8 is a schematic illustration showing an exemplary state in which the piezo-effect film used in the present invention is not polarized and an exemplary state in which it is polarized.

In the present invention, as a method of forming piezo-effect film 6, for example, a sputtering method may be used. In the sputtering method, the magnitude or direction of internal stress of a film (tensile stress or compressive stress) may be varied depending on the deposition conditions. More specifically, if an atmospheric gas pressure during sputtering is high, the internal stress of piezo-effect film 6 bound to the underlayer becomes compressive stress (stress to stretch). If an atmospheric gas pressure is low, the internal stress of piezo-effect film 6 becomes tensile stress (stress to shrink). Moreover, piezo-effect film 6 stretches/shrinks when polarized. Specifically, as shown in FIG. 8, piezo-effect film 6 stretches in the c-axis direction when polarized and shrinks in the a-axis, b-axis directions (in FIG. 8, the solid line shows the state in which piezo-effect film 6 is not polarized and the broken line shows the state in which it is polarized).

For example, concerning FIG. 1, when piezo-effect film 6 is formed under an atmospheric pressure of less than 1 Pa by the sputtering method, it becomes possible to cancel the tensile stress (stress to stretch second nitride semiconductor layer 4) applied from first nitride semiconductor layer 3 to second nitride semiconductor layer 4. In other words, the tensile stress (stress to shrink) which is the internal stress of piezo-effect film 6 exerts compressive stress on (acts to shrink) second nitride semiconductor layer 4 and, as a result, acts to cause the tensile stress (stress to shrink), which is the internal stress of second nitride semiconductor layer 4, to become extinct. Accordingly, formation of two-dimensional electron gas layer 10 due to the stress of second nitride semiconductor layer 4 can be restrained. Therefore, in combination with the polarization effect of piezo film 6 as described above, two-dimensional electron gas 21 can easily become extinct.

More specifically, for example concerning FIG. 1, first nitride semiconductor layer 3 formed of GaN has lattice constant $a_1$ and second nitride semiconductor layer 4 formed of $Al_{0.3}Ga_{0.7}N$ has lattice constant of $a_2$, and the relation between these lattice constants is $a_1 > a_2$. Therefore, second nitride semiconductor layer 4 which is a thin film receives tensile stress, resulting in that two-dimensional electron gas layer 10 is formed on the first nitride semiconductor layer 3 side of the interface between first nitride semiconductor layer 3 and second nitride semiconductor layer 4. Here, if piezo-effect film 6 is formed to exert compressive stress on second nitride semiconductor layer 4, the tensile stress which is the internal stress of second nitride semiconductor layer 4 is reduced. Further, in this state, piezo-effect film 6 is polarized without application of a gate voltage, and therefore electric charges are induced to second nitride semiconductor layer 4 and first nitride semiconductor layer 3, resulting in less production of two-dimensional electron gas. In this way, in combination with the polarization effect of piezo film 6, two-dimensional electron gas 21 can easily become extinct.

In addition, concerning FIG. 5, when piezo-effect film 6 is formed under an atmospheric pressure larger than 1 Pa by the sputtering method, it becomes possible to cancel the compressive stress (stress to shrink second nitride semiconductor layer 14) applied from first nitride semiconductor layer 13 to second nitride semiconductor layer 14. In other words, the compressive stress (stress to stretch) which is the internal stress of piezo-effect film 6 exerts tensile stress on (acts to stretch) second nitride semiconductor layer 14 and, as a result, acts to cause the compressive stress (stress to stretch), which is the internal stress of second nitride semiconductor layer 14, to become extinct. Accordingly, formation of two-dimensional electron gas layer 10 due to the stress of second nitride semiconductor layer 14 can be restrained. Therefore, in combination with the polarization effect of piezo film 6 as described above, two-dimensional electron gas 21 can easily become extinct.

More specifically, for example concerning FIG. 5, first nitride semiconductor layer 13 formed of $Al_{0.3}Ga_{0.7}N$ has lattice constant $a_1$ and second nitride semiconductor layer 14 formed of GaN has lattice constant of $a_2$, and the relation between these lattice constants is $a_1 < a_2$. Therefore, second nitride semiconductor layer 14 which is a thin film receives compressive stress, resulting in that two-dimensional electron gas layer 10 is formed on the second nitride semiconductor layer 14 side of the interface between first nitride semiconductor layer 13 and second nitride semiconductor layer 14. Here, if piezo-effect film 6 is formed to exert tensile stress on second nitride semiconductor layer 14, the compressive stress which is the internal stress of second nitride semiconductor layer 14 is reduced. Further, in this state, piezo-effect film 6 is polarized without application of a gate voltage, and therefore electric charges are induced to second nitride semiconductor layer 14, resulting in less production of two-dimensional electron gas. In this way, in combination with the polarization effect of piezo film 6, two-dimensional electron gas 21 can easily become extinct.

Alternatively, in the present invention, as piezo-effect film 6, a piezo material made of an organic material may be used. Here, as a piezo material made of an organic material used for piezo-effect film 6, poly(vinylidene fluoride) may suitably be used because of its superior piezo effect.

In the case where a piezo material made of an organic material is used as piezo-effect film 6, piezo-effect film 6 can be formed by applying a piezo material made of an organic material on the surface of the second nitride semiconductor layer by a spin-coat method followed by drying. Here, the drying temperature after application of a piezo material made of an organic material may be, for example, 80° C. or higher and 150° C. or lower, which may be lower than the temperature of the semiconductor substrate in formation of piezo-effect film 6 by the sputtering method using a piezo material made of an inorganic material as described above and a firing temperature (for example, 500° C. or higher and 700° C. or lower) in formation of piezo-effect film 6 by the spin-coat method using a piezo material made of an inorganic material. Furthermore, in the case where a piezo material made of an organic material is used, the firing step in formation of piezo-effect film 6 by the spin-coat method using a piezo material made of an inorganic material may not be performed.

In the case where a piezo material made of an organic material is used in this way, as compared with the case using a piezo material made of an inorganic material as described above, piezo-effect film 6 can be formed at a lower temperature. Accordingly, in formation of piezo-effect film 6, a characteristic change caused by heating can be restrained in the buffer layer, the first nitride semiconductor layer and the second nitride semiconductor layer. Here, a characteristic change includes, for example, occurrence of lattice defect in the first nitride semiconductor layer and the second nitride semiconductor layer, a change in bandgap, and the like. Therefore, the use of a piezo material made of an organic material such as poly(vinylidene fluoride) can reduce occurrence of malfunction of FET in the present invention and improve reliability.

In the present invention, as the first nitride semiconductor layer and the second nitride semiconductor layer, other than the aforementioned GaN and $Al_{0.3}Ga_{0.7}N$, a layer formed of a nitride semiconductor represented by a composition formula of $Al_xGa_{1-x-y}In_yN$ (where $0 \leq x \leq 1$, $0 \leq y \leq 1$) may be used. In other words, by selecting the respective composition ratios of Al, Ga and In as appropriate, the first nitride semiconductor layer and the second nitride semiconductor layer having lattice constant and bandgap suitable for the first nitride semiconductor layer and the second nitride semiconductor layer as described above can be formed. In the aforementioned composition formula of $Al_xGa_{1-x-y}In_yN$, generally, with higher composition ratio of Al, the bandgap increases and the lattice constant tends to decrease, and with higher composition ratio of In, the bandgap decreases and the lattice constant tends to increase.

Figure 9:
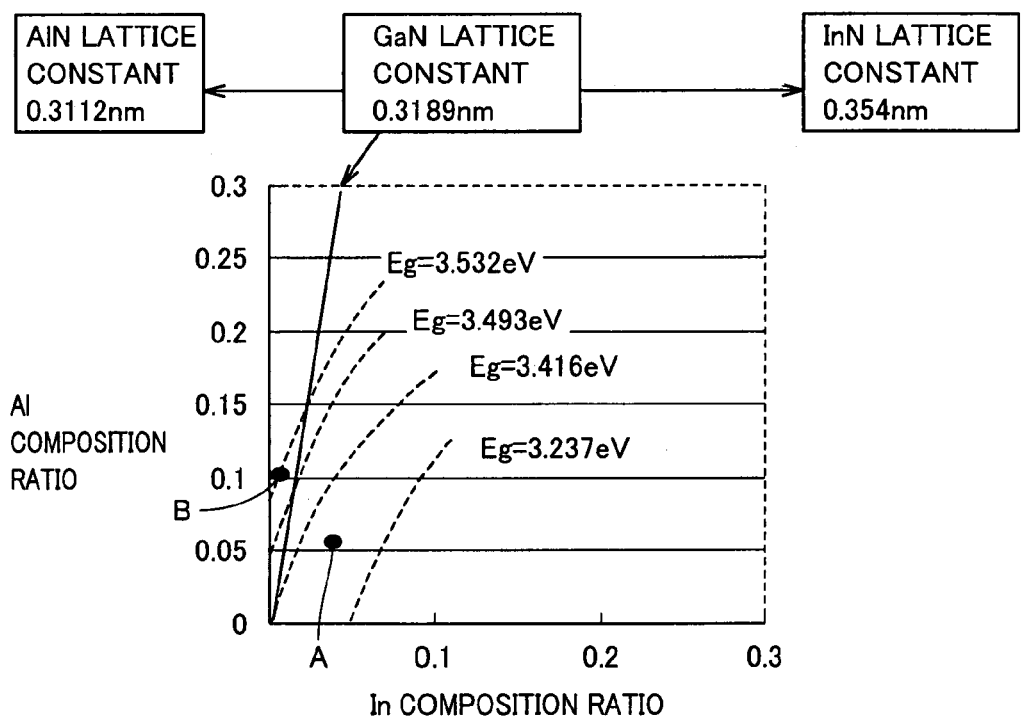
FIG. 9 is a graph illustrating a lattice constant and a bandgap depending on an In composition ratio and an Al composition ratio in AlGaInN.

In connection with this, in the graph in FIG. 9 (cited from MATERIALS RESEARCH SOCIETY SYMPOSIUM PROCEEDING, Vol. 595, GaN and Related Alloys, 1999, w6.2.7), the axis of abscissas represents an In composition ratio in AlGaInN and the axis of ordinates represents an Al composition ratio. In the graph, the bold solid sloped line represents the In composition ratio and the Al composition ratio in AlGaInN having the same lattice constant as the lattice constant of GaN. In other words, AlGaInN having the In composition ratio and the Al composition ratio in the region to the right of the solid sloped line has a lattice constant larger than GaN, and AlGaInN having the In composition ratio and the Al composition ratio in the left region has a lattice constant smaller than GaN. Furthermore, the broken curved line in the graph represents the changed bandgap depending on the In composition ratio and the Al composition ratio in AlGaInN.

For example, the bandgap of AlGaInN having a composition ratio at point A in FIG. 9 is smaller than the bandgap of GaN (Eg=3.42 eV), and the lattice constant of AlGaInN having that composition ratio is larger than the lattice constant of GaN (a=3.189 Å). By contrast, the bandgap of AlGaInN having a composition ratio at point B is larger than the bandgap of GaN, and the lattice constant of AlGaInN having that composition ratio is smaller than the lattice constant of GaN. Therefore, an AlGaInN layer having the composition ratio at point A can be used in place of a GaN layer, and an AlGaInN layer having the composition ratio at point B can be used in place of an AlGaN layer.

Although it has been described above that the piezo-effect film is formed on a region of a part of a surface of the second nitride semiconductor layer between the source electrode and the drain electrode, in the present invention, the piezo-effect film may be formed on a region of the entire surface of the second nitride semiconductor layer between the source electrode and the drain electrode.

Furthermore, although it has been described above that the gate electrode is formed on a region of a part of a surface of the piezo-effect film, in the present invention, the gate electrode may be formed on a region of the entire surface of the piezo-effect film.

EXAMPLE 1

FET of Example 1 having the cross-sectional structure shown in FIG. 1 was fabricated. In fabrication of this FET, first, buffer layer 2 (20 nm thick) formed of AlN was grown on an Si atomic plane of semiconductor substrate 1 formed of SiC with the temperature of semiconductor substrate 1 of 1200° C. by MOCVD (metal organic chemical vapor deposition). Then, with the temperature of semiconductor substrate 1 of 1100° C., first nitride semiconductor layer 3 formed of GaN (lattice constant $a_1$=3.189 Å, $Eg_1$=3.42 eV) was grown to a thickness of 3 μm. With the temperature of semiconductor substrate 1 of 1100° C., second nitride semiconductor layer 4 formed of $Al_{0.3}Ga_{0.7}N$ ($a_2$=3.166 Å, $Eg_2$=4.02 eV) was grown thereon to a thickness of 20 nm.

Thereafter, in order to form source electrode 5a and drain electrode 5b, a resist is patterned using a photolithography method, and an Hf film (10 nm thick)/an Al film (100 nm thick)/an Hf film (40 nm thick)/an Au film (240 nm thick) were then stacked in this order to form a multi-layered metal film. After lift-off, a thermal process was performed at 825° C. for 30 seconds.

Furthermore, in a region excluding source electrode 5a and drain electrode 5b on second nitride semiconductor layer 4, a $BaTiO_3$ film was deposited as piezo-effect film 6 at a thickness of 500 nm by the sputtering method at room temperature (25° C.). Here, as for the sputtering method, reactive sputtering was performed with plasma of a mixture of Ar and $O_2$ using a $BaTiO_3$ target. In order for piezo-effect film 6 to achieve tensile stress as internal stress, a sputtering pressure was set, for example, to 0.5 Pa. Then, gate electrode 7 formed of Au was formed on piezo-effect film 6.

Figure 10:
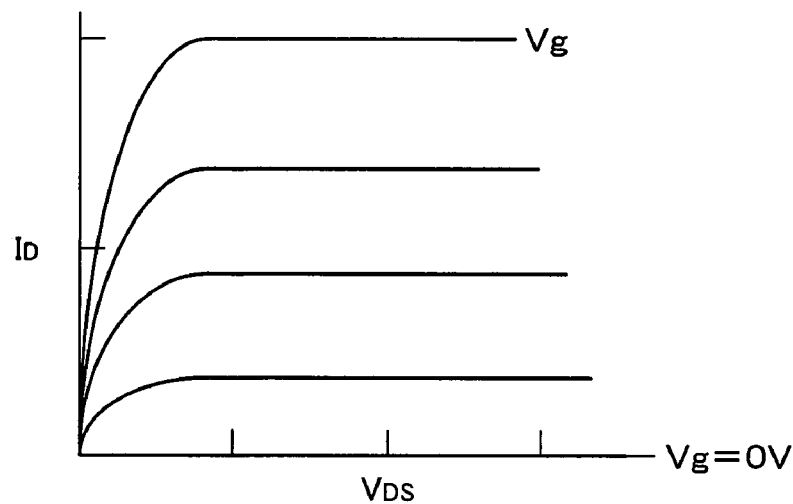
FIG. 10 is a schematic graph showing a current-voltage characteristic of FET in Example 1.

FIG. 10 is a schematic graph showing a current-voltage characteristic of FET of Example 1 fabricated in this manner. Specifically, in this graph, the axis of abscissas represents source-drain voltage $V_{DS}$ and the axis of ordinates represents drain current $I_D$. As can be seen from FIG. 10, in FET of Example 1, when gate voltage Vg is 0 V, drain current does not flow ($I_D$=0).

Therefore, in FET of Example 1, it was confirmed that a normally-off type FET was realized.

Thus, in FET of Example 1, the residual polarization density at that surface of piezo-effect film 6 facing second nitride semiconductor layer 4 is equal to or higher than the density of electric charges of the two-dimensional electron gas layer at the interface between first nitride semiconductor layer 3 and second nitride semiconductor layer 4, and negative charges are present at that surface of piezo-effect film 6 facing second nitride semiconductor layer 4, so that it is believed that the two-dimensional electron gas forming the two-dimensional electron gas layer positioned in the region corresponding to the formation region of piezo-effect film 6 is cancelled and the two-dimensional electron gas layer exists only in the region corresponding to the outside of the formation region of piezo-effect film 6.

EXAMPLE 2

Figure 11:
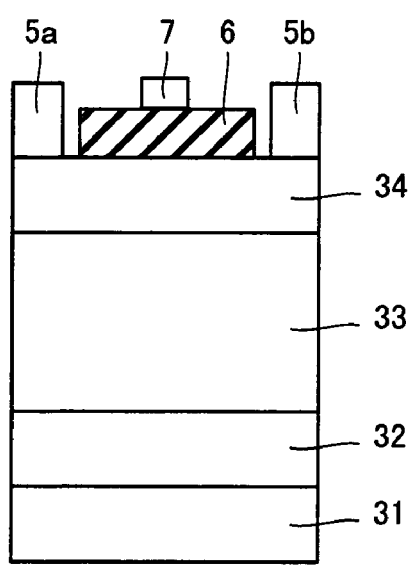
FIG. 11 is schematic cross-sectional view of FET in Example 2.
Figure 12:
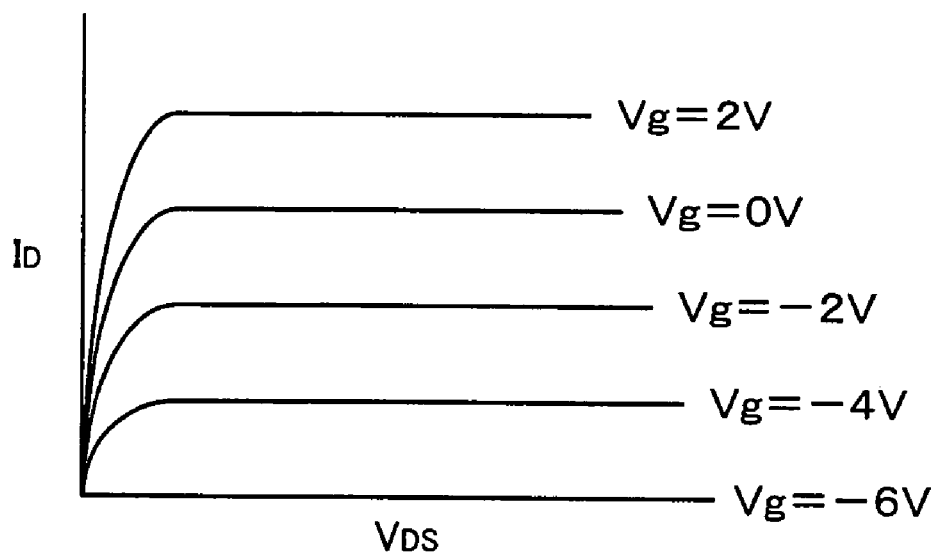
FIG. 12 is a schematic graph of an exemplary $I_D$-$V_{DS}$ characteristic of a normally-on type FET.
Figure 13:
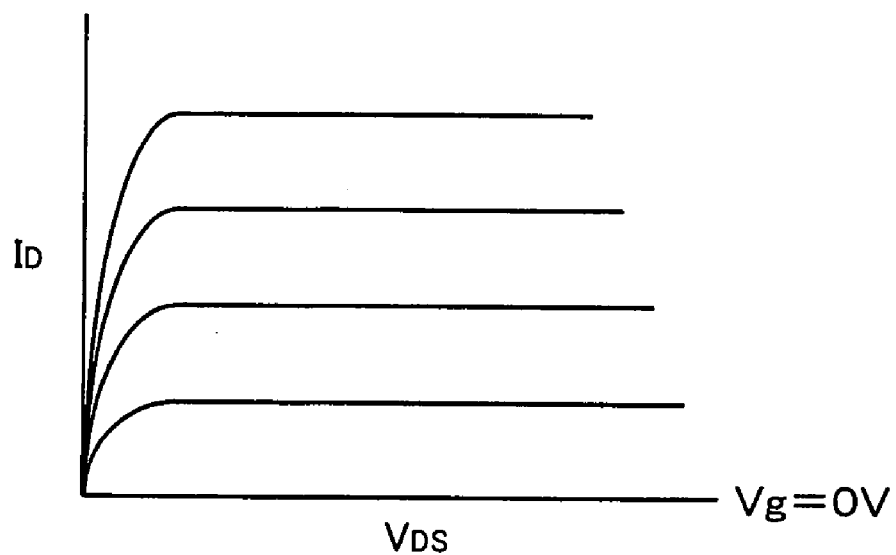
FIG. 13 a schematic graph of an exemplary $I_D$-$V_{DS}$ characteristic of a normally-off type FET.

FET of Example 2 having a cross-sectional structure shown in FIG. 11 was fabricated. In fabrication of this FET, a buffer layer 32 formed of a multilayer-film of AlN layer/GaN layer was first deposited on a semiconductor substrate 31 formed of Si. Then, with the temperature of semiconductor substrate 31 of 1000° C., a first nitride semiconductor layer 33 formed of GaN (lattice constant $a_1$=3.189 Å, $Eg_1$=3.42 eV) was grown to a thickness of 1 μm. A second nitride semiconductor layer 34 formed of $Al_{0.2}Ga_{0.8}N$ ($a_2$=3.174 Å, $Eg_2$=3.80 eV) was grown thereon to a thickness of 30 nm, with the temperature of semiconductor substrate 31 of 1100° C.

Thereafter, similarly to Example 1, source electrode 5a, drain electrode 5b, piezo-effect film 6 and gate electrode 7 were formed thereby to fabricate FET of Example 2.

The current-voltage characteristic of FET of Example 2 fabricated in this manner was determined similarly to Example 1. Drain current did not flow when gate voltage Vg is 0 V.

Therefore, in FET of Example 2, it was confirmed that a normally-off type FET was realized.

Thus, also in FET of Example 2, the residual polarization density in piezo-effect film 6 is equal to or higher than the density of electric charges of the two-dimensional electron gas layer at the interface between first nitride semiconductor layer 33 and second nitride semiconductor layer 34, and negative charges are polarized at that surface of piezo-effect film 6 facing second nitride semiconductor layer 34, so that it is believed that the two-dimensional electron gas forming the two-dimensional electron gas layer positioned in the region corresponding to the formation region of piezo-effect film 6 is cancelled and the two-dimensional electron gas layer exists only in the region corresponding to the outside of the formation region of piezo-effect film 6.

EXAMPLE 3

FET of Example 3 having a cross-sectional structure shown in FIG. 5 was fabricated. In FET of Example 1 and Example 2, the layers are stacked in such a manner that a Ga atomic plane lies on each of the upper surface (the surface on which electrodes are to be formed) of the first nitride semiconductor layer and the upper surface (the surface on which electrodes are to be formed) of the second nitride semiconductor layer. However, in FET of Example 3, the layers are stacked in such a manner that an N atomic plane lies on each of the upper surface (the surface on which electrodes are to be formed) of the first nitride semiconductor layer and the upper surface (the surface on which electrodes are to be formed) of the second nitride semiconductor layer.

In fabrication of this FET, first, buffer layer 12 formed of AlN, first nitride semiconductor layer 13 formed of AlGaN and second nitride semiconductor layer 14 formed of GaN were grown in this order on the C atomic plane of semiconductor substrate 11 formed of SiC.

Here, the relation between lattice constant $a_1$ of first nitride semiconductor layer 13 and lattice constant $a_2$ of second nitride semiconductor layer 14 was $a_1<a_2$ (as the mixed crystal ratio of Al is higher, lattice constant $a_1$ of first nitride semiconductor layer 13 formed of AlGaN becomes smaller than lattice constant $a_2$ of second nitride semiconductor layer 14 formed of GaN), and the relation between bandgap $Eg_1$ of first nitride semiconductor layer 13 and bandgap $Eg_2$ of second nitride semiconductor layer 14 was $Eg_1>Eg_2$.

In FET of Example 3, contrary to FET of Example 1 and Example 2, second nitride semiconductor layer 14 formed of GaN has compressive stress as internal stress. Then, as described above, each of first nitride semiconductor layer 13 and second nitride semiconductor layer 14 is stacked in such a manner that the N atomic plane lies on the upper surface.

Therefore, it is believed that a two-dimensional electron gas layer is formed on the second nitride semiconductor layer 14 side of the interface between first nitride semiconductor layer 13 and second nitride semiconductor layer 14.

The current-voltage characteristic of FET of Example 3 fabricated in this manner was determined similarly to Example 1. Drain current did not flow when gate voltage Vg was 0 V.

Therefore, in FET of Example 3, it was confirmed that a normally-off type FET was realized.

Thus, also in FET of Example 3, the residual polarization density at that surface of piezo-effect film 6 facing second nitride semiconductor layer 14 is equal to or higher than the density of electric charges of the two-dimensional electron gas layer at the interface between first nitride semiconductor layer 13 and second nitride semiconductor layer 14, and positive charges are polarized at that surface of piezo-effect film 6 facing second nitride semiconductor layer 14, so that it is believed that the two-dimensional electron gas forming the two-dimensional electron gas layer positioned in the region corresponding to the formation region of piezo-effect film 6 is cancelled and the two-dimensional electron gas layer exists only in the region corresponding to the outside of the formation region of piezo-effect film 6.

In accordance with the present invention, it is possible to provide a normally-off type FET including a heterostructure of nitride semiconductor layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field-effect transistor comprising:
   a first nitride semiconductor layer having a lattice constant $a_1$ and a bandgap $Eg_1$;
   a second nitride semiconductor layer stacked on said first nitride semiconductor layer and having a lattice constant $a_2$ and a bandgap $Eg_2$;
   a source electrode and a drain electrode formed on said second nitride semiconductor layer;
   a piezo-effect film formed on said second nitride semiconductor layer in at least a part of a region between said source electrode and said drain electrode; and
   a gate electrode formed on a region of at least a part of said piezo-effect film, wherein
   a relation between said lattice constants $a_1$ and $a_2$ is $a_1>a_2$,
   a relation between said bandgaps $Eg_1$ and $Eg_2$ is $Eg_1<Eg_2$, and
   a residual polarization density at that surface of said piezo-effect film which faces said second nitride semiconductor layer is equal to or higher than a density of electric charges of a two-dimensional electron gas layer at an interface between said first nitride semiconductor layer and said second nitride semiconductor layer, and negative charges are polarized at that surface of said piezo-effect film which faces said second nitride semiconductor layer.

2. The field-effect transistor according to claim 1, wherein said piezo-effect film is formed of an oxide having a perovskite structure.

3. The field-effect transistor according to claim 2, wherein said oxide having a perovskite structure is an oxide including Ba and Ti, an oxide including Pb, La, Zr and Ti, an oxide including Sr, Bi and Ta, an oxide including Bi and Ti, an oxide including Li and Nb, or an oxide including Sr and Nb.

4. The field-effect transistor according to claim 1, wherein said piezo-effect film is formed of a fluoride having a fluorite structure.

5. The field-effect transistor according to claim 4, wherein said fluoride having a fluorite structure is a fluoride including Ba and Mg or a fluoride including Ba and Mn.

6. The field-effect transistor according to claim 1, wherein said piezo-effect film is formed by a sputtering method.

7. The field-effect transistor according to claim 1, wherein said piezo-effect film is formed under an atmospheric pressure of less than 1 Pa by a sputtering method.

8. A field-effect transistor comprising:
a first nitride semiconductor layer having a lattice constant $a_1$ and a bandgap $Eg_1$;
a second nitride semiconductor layer stacked on said first nitride semiconductor layer and having a lattice constant $a_2$ and a bandgap $Eg_2$;
a source electrode and a drain electrode formed on said second nitride semiconductor layer;
a piezo-effect film formed on said second nitride semiconductor layer in at least a part of a region between said source electrode and said drain electrode; and
a gate electrode formed on a region of at least a part of said piezo-effect film, wherein
a relation between said lattice constants $a_1$ and $a_2$ is $a_1<a_2$,
a relation between said bandgaps $Eg_1$ and $Eg_2$ is $Eg_1>Eg_2$, and
a residual polarization density at that surface of said piezo-effect film which faces said second nitride semiconductor layer is equal to or higher than a density of electric charges of a two-dimensional electron gas layer at an interface between said first nitride semiconductor layer and said second nitride semiconductor layer, and positive charges are polarized at that surface of said piezo-effect film which faces said second nitride semiconductor layer.

9. The field-effect transistor according to claim 8, wherein said piezo-effect film is formed of an oxide having a perovskite structure.

10. The field-effect transistor according to claim 9, wherein said oxide having a perovskite structure is an oxide including Ba and Ti, an oxide including Pb, La, Zr and Ti, an oxide including Sr, Bi and Ta, an oxide including Bi and Ti, an oxide including Li and Nb, or an oxide including Sr and Nb.

11. The field-effect transistor according to claim 8, wherein said piezo-effect film is formed of a fluoride having a fluorite structure.

12. The field-effect transistor according to claim 11, wherein said fluoride having a fluorite structure is a fluoride including Ba and Mg or a fluoride including Ba and Mn.

13. The field-effect transistor according to claim 8, wherein said piezo-effect film is formed by a sputtering method.

14. The field-effect transistor according to claim 8, wherein said piezo-effect film is formed under an atmospheric pressure of larger than 1 Pa by a sputtering method.

15. A field-effect transistor comprising:
a first nitride semiconductor layer having a lattice constant $a_1$ and a bandgap $Eg_1$;
a second nitride semiconductor layer stacked on said first nitride semiconductor layer and having a lattice constant $a_2$ and a bandgap $Eg_2$;
a source electrode and a drain electrode formed on said second nitride semiconductor layer;
a piezo-effect film formed on said second nitride semiconductor layer in at least a part of a region between said source electrode and said drain electrode; and
a gate electrode formed on a region of at least a part of said piezo-effect film, wherein
a relation between said lattice constants $a_1$ and $a_2$ is $a_1>a_2$,
a relation between said bandgaps $Eg_1$ and $Eg_2$ is $Eg_1<Eg_2$,
a residual polarization density at that surface of said piezo-effect film which faces said second nitride semiconductor layer is equal to or higher than a density of electric charges of a two-dimensional electron gas layer at an interface between said first nitride semiconductor layer and said second nitride semiconductor layer, and negative charges are polarized at that surface of said piezo-effect film which faces said second nitride semiconductor layer, and
said piezo-effect film exerts compressive stress on said second nitride semiconductor layer.

16. A field-effect transistor comprising:
a first nitride semiconductor layer having a lattice constant $a_1$ and a bandgap $Eg_1$;
a second nitride semiconductor layer stacked on said first nitride semiconductor layer and having a lattice constant $a_2$ and a bandgap $Eg_2$;
a source electrode and a drain electrode formed on said second nitride semiconductor layer;
a piezo-effect film formed on said second nitride semiconductor layer in at least a part of a region between said source electrode and said drain electrode; and
a gate electrode formed on a region of at least a part of said piezo-effect film, wherein
a relation between said lattice constants $a_1$ and $a_2$ is $a_1<a_2$,
a relation between said bandgaps $Eg_1$ and $Eg_2$ is $Eg_1>Eg_2$,
a residual polarization density at that surface of said piezo-effect film which faces said second nitride semiconductor layer is equal to or higher than a density of electric charges of a two-dimensional electron gas layer at an interface between said first nitride semiconductor layer and said second nitride semiconductor layer, and positive charges are polarized at that surface of said piezo-effect film which faces said second nitride semiconductor layer, and
said piezo-effect film exerts tensile stress on said second nitride semiconductor layer.

* * * * *